United States Patent [19]

Schehr

[11] Patent Number: 5,135,196
[45] Date of Patent: Aug. 4, 1992

[54] MULTI-AXIS POSITIONAL GIMBAL

[75] Inventor: Douglas K. Schehr, Columbia, Md.

[73] Assignee: The United States of America as represented by the Secretary of the Air Force, Washington, D.C.

[21] Appl. No.: 502,599

[22] Filed: Mar. 30, 1990

[51] Int. Cl.⁵ .............................................. A47H 1/10
[52] U.S. Cl. .................................... 248/324; 248/287
[58] Field of Search ............... 248/324, 325, 326, 279, 248/280.1, 287, 181, 123.1, 124, 297.1; 414/737, 590, 744.7; 901/48, 17, 18

[56] References Cited

U.S. PATENT DOCUMENTS

| | | | |
|---|---|---|---|
| 1,562,650 | 11/1925 | Meyer | 248/123.1 X |
| 1,754,006 | 4/1930 | Anderson | 248/123.1 |
| 2,051,508 | 8/1936 | Wildeboer | 248/123.1 |
| 2,293,879 | 8/1942 | Anderson | 248/287 |
| 2,837,307 | 6/1958 | Schwager | 248/325 |
| 3,123,024 | 3/1964 | Bronson | 248/123.1 X |
| 3,627,250 | 12/1971 | Pegrum | 248/324 |
| 3,722,842 | 3/1973 | Schweizer | 248/287 X |
| 4,226,569 | 10/1980 | Gerard et al. | 414/737 |
| 4,577,819 | 3/1986 | Bennett | 248/123.1 |
| 4,765,580 | 8/1988 | Wright | 248/181 |
| 4,836,478 | 6/1989 | Sweere | 248/280.1 X |
| 4,973,015 | 11/1990 | Beaucoup | 414/590 X |

Primary Examiner—J. Franklin Foss
Attorney, Agent, or Firm—Jacob N. Erlich; Donald J. Singer

[57] ABSTRACT

A multi-axis positional gimbal assembly is provided having a junction member with two passageways therein at angles to each other, a first arm sized to insert into one of the passageways and to axially shift therein and a second arm sized to insert into the other of said passageways and to to axially shift therein. The arms are provided with locking means to releasably secure them in the passageways. The upper end of the first arm is mounted to a support member as a microscope. The distal end of the second (and lower) arm, supports a pallet pivotably mounted thereon at a point removed from the junction member. The second arm is pivotable about the axis of the first arm and also movable up and down on said first arm so as to move such pallet on all three axes, as desired, which pallet can be tilted to any desired attitude and arms and pallet locked in place. In a preferred embodiment a constant force spring is mounted between the junction member and the upper portion of the first arm or the support member, to apply an upward counter-force to the junction member, second arm and pallet to substantially offset the weight thereof so that an operator may more easily maneuver the pallet in all directions, e.g. into focus of the field of a microscope and then remain in place, when when the operator's hand is removed for note taking, operating other equipment and the like. The pallet can thus support a printed circuit thereon and position such circuit in the field of view of a microscope for examination of defects and mapping the location thereof.

11 Claims, 8 Drawing Sheets

MULTI-AXIS POSITIONAL GIMBAL

STATEMENT OF GOVERNMENT INTEREST

The invention described herein may be manufactured and used by or for the Government for governmental purposes without the payment of any royalty thereon.

BACKGROUND OF THE INVENTION

1. Field of the Invention

This invention relates to a gimbal which can move on all three axes, particularly a gimbal having a support surface for an article which can move same into a desired position and accurately sustain said position.

1. The Prior Art

In the production of components, e.g., electrical components, there is often a requirement for locating microscopic defects therein so as to reject or repair such components and improve the quality of the product. For example, it is necessary to inspect electrical substrates, e.g., a printed wiring assembly (PWA) using small components. In the prior art, such substrate is held by hand under a microscope and is turned at various angles that the viewer may see defects, e.g., at the soldered joints thereof. The viewer attempts to memorize the coordinates of the defect, puts the substrate down, e.g., on a work surface and enters the coordinates into a mapping system or attempts to hold the substrate in place under the microscope with one hand, while operating, e.g., an inspection digitizing system (IDS). Of course, under a microscope a slight tremor of the hand can move the substrate and located defect out of focus and/or out of position, causing the recording of erroneous data and inaccurate mapping of such defects. Even if the substrate be held accurately under the microscope, the arm soon tires and becomes less steady. Meanwhile the viewer has but one other arm to operate the above IDS or other equipment or to make notes and, of course, cannot move about without removing the substrate from the viewing field.

What is needed is an apparatus which can position a substrate in the above viewing field with sustained accuracy, so as to free the viewer's hands to perform other tasks, operate other equipment, to make notes thereof and the like.

Looking at the prior art, one sees a clamping means with a ball and socket base for holding a loudspeaker, U.S. Pat. No. 4,765,580 (1988) and a leveling stage of limited movement relative to a reference plane, U.S. Pat. No. 4,226,569 (1980).

Thus, both the above clamping means and leveling stage are able to tilt but otherwise display confined movement near their respective support surfaces.

On the other hand, U.S. Pat. No. 4,577,819 (1986) discloses a boom apparatus which has considerably greater range of movement of boom pivoting around a support post in the vertical plane as well as in the horizontal plane. However, here the boom cannot accurately sustain its position in the vertical plane and must be locked at three points thereon by spring-loaded plunger 88 (FIG. 4) and thus displays limited or 3 point stability in such plane, which while fine for the intended purpose of mobility of a welding apparatus at the distal end of such boom, would not be satisfactory for freely positioning an article in a microscopic field with sustained accuracy.

Thus the prior art does not suggest an accurate positioning mechanism, e.g., in a microscopic field, and there is a need and market for an accurate inspection apparatus that overcomes the above prior art shortcomings and frees the hands of the viewer for complementary or other tasks.

There has now been discovered an inspection apparatus which has the flexibility and range of movement associated with hands-on feeling of inspection, which provides the necessary positional accuracy for mapping of small components and which frees the hands for other duties.

SUMMARY OF THE INVENTION

Broadly, the present invention provides a multi-axis positionable gimbal comprising; a first arm mounted to a support member at one end and a second arm mounted to the first arm at an angle and proximate the other end thereof. An article support is pivotably mounted on the second arm proximate the distal end thereof. Also provided are means for pivoting the second arm transversely on the first arm, as are means for pivoting the article support on the second arm to move the article support into a desired location and angle for observation and mapping thereof.

Desirably, a pallet of the apparatus of the invention is pivotally mounted on a ball and socket joint mounted on the above second arm. Preferably, a lock is mounted on the ball and socket joint, to lock the pallet and its contents, e.g., a substrate, at a desired angle for inspection.

Desirably the arm sections are adjustable in length for greater positionable choice in article inspection.

In another embodiment, a negator spring is provided to assist the positional accuracy of the pallet and adjacent arm section as further discussed below.

BRIEF DESCRIPTION OF THE DRAWINGS

The invention will become more apparent from the following detailed specification and drawings in which.

DESCRIPTION OF PREFERRED EMBODIMENTS

Figure 1:
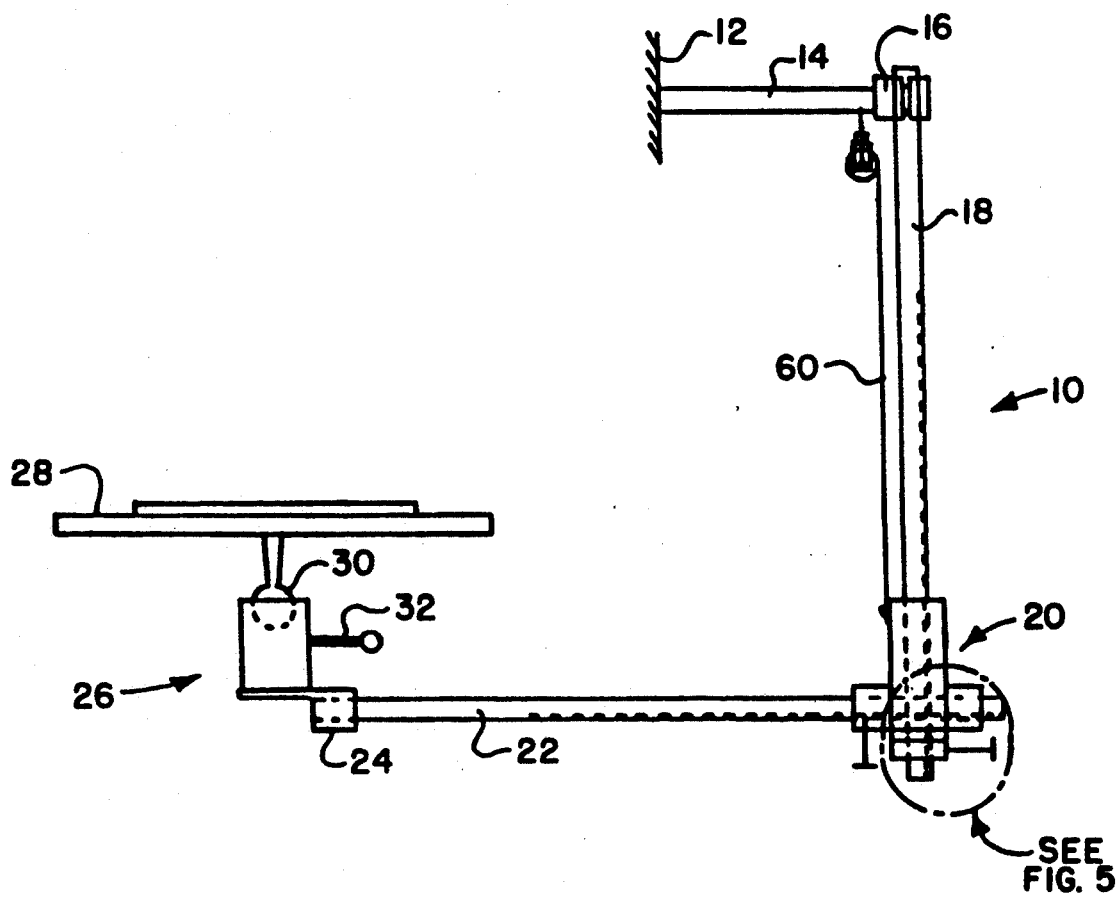
FIG. 1 is an elevation view of a gimbal apparatus embodying the present invention.
Figure 2:
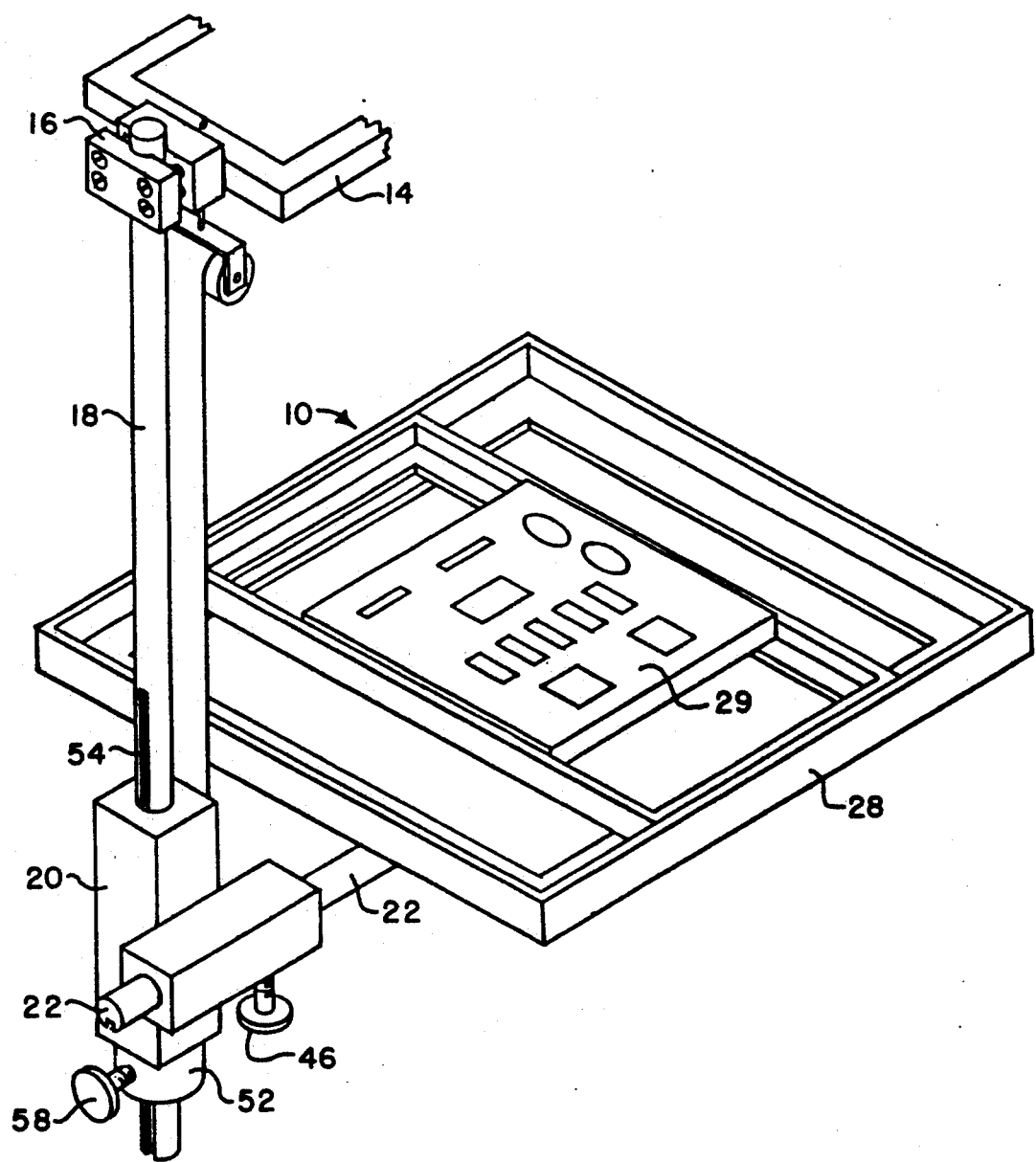
FIG. 2 is a perspective view of the gimbal assembly embodying the invention shown in FIG. 1, taken on lines 2—2 of FIG. 1, looking in the direction of the arrows.
Figure 3:
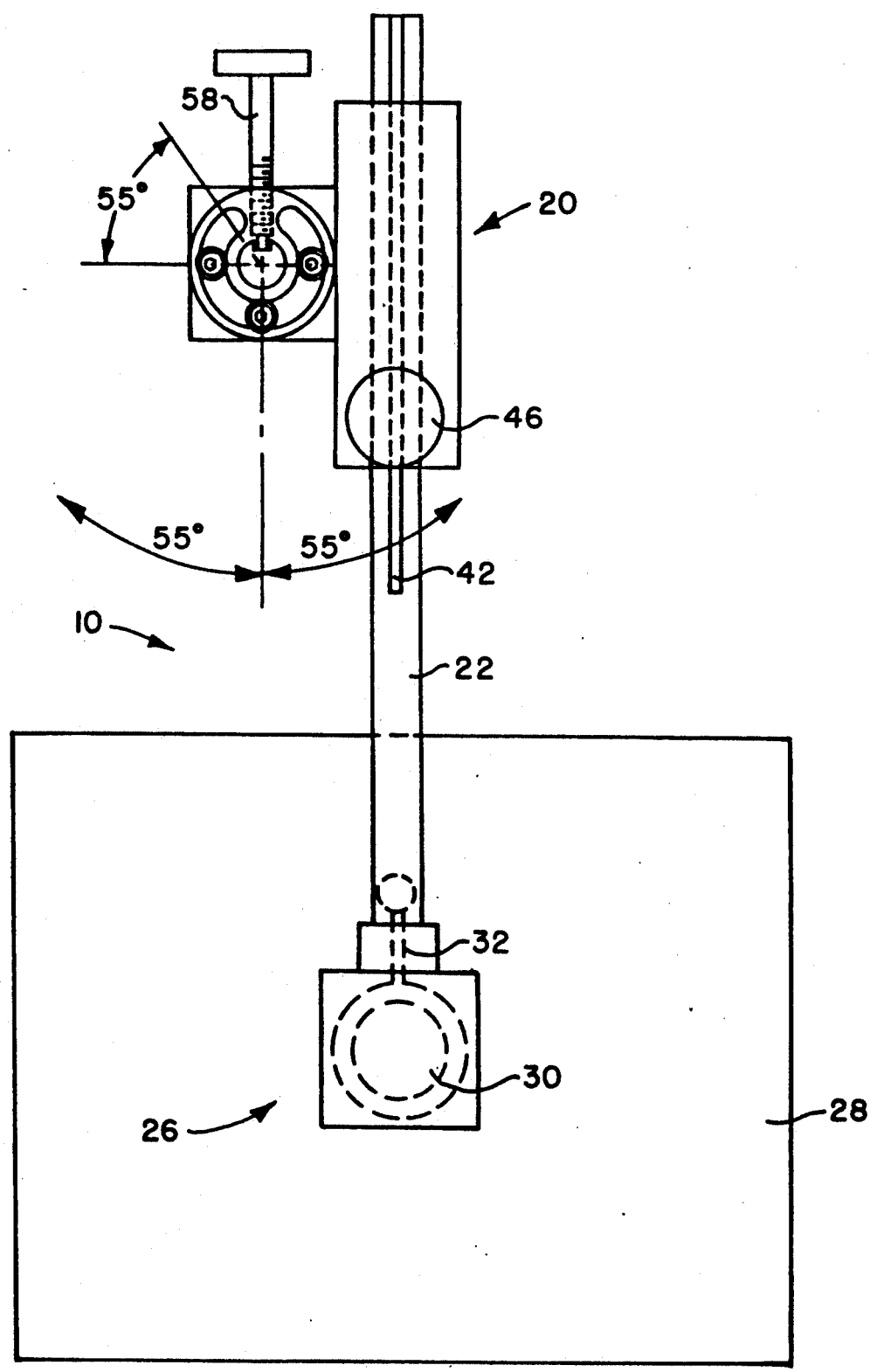
FIG. 3 is a bottom plan view of the gimbal assembly embodying the invention shown in FIGS. 1 and 2, taken on lines 3—3 looking in the direction of the arrows.
Figure 4:
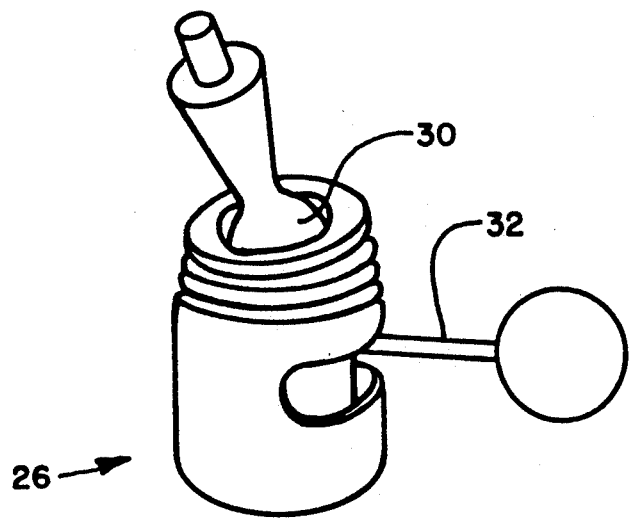
FIGS. 4 is a perspective view of a component of the gimbal assembly embodying the invention, as shown in FIG. 1.
Figure 9:
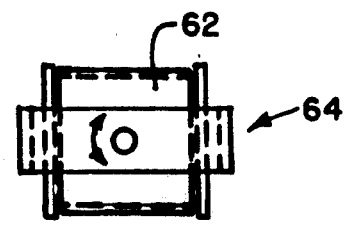
FIG. 9 is a top plan view of the component of the gimbal assembly of the invention shown in FIG. 8.
Figures 7, 8:
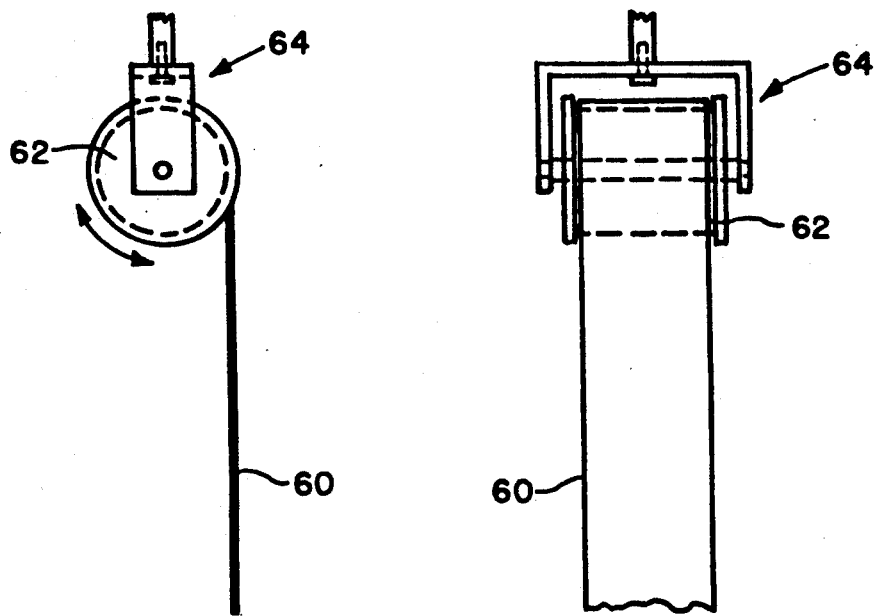
FIGS. 7, and 8 are fragmentary end and side elevation views respectively of another component of the gimbal assembly embodying the invention as shown in FIG. 1.

Referring now in more detail to the drawings, a multi-axis positional gimbal 10 is attached to a support surface 12 and support members 14 and 15 and includes a first arm 18, a junction member or linear bearing assembly 20, a second arm 22, a ball and socket mounting 24, a ball and socket joint 26 and a pallet 28, pivotably mounted on such joint 26, as shown in FIGS. 1, 2 and 3. The pallet 28 is mounted to pivot on the ball 30 of the ball and socket joint 26 and be locked into a desired position by locking lever 32, as shown or indicated in FIGS. 1 and 4. The second arm 22 slides axially through channel 40 of bearing or junction member 20, as shown or indicated in FIGS. 2, 5 and 6. The second arm 22 has a keyway 42, along at least part of its length while the junction member 20 has a threaded aperture 44 therethrough and a locking screw 46 in threaded engagement therewith to contact the keyway 42 and fix the second arm 22 in position in the junction member 20, as shown or indicated in FIGS. 5 and 6.

Figure 5:
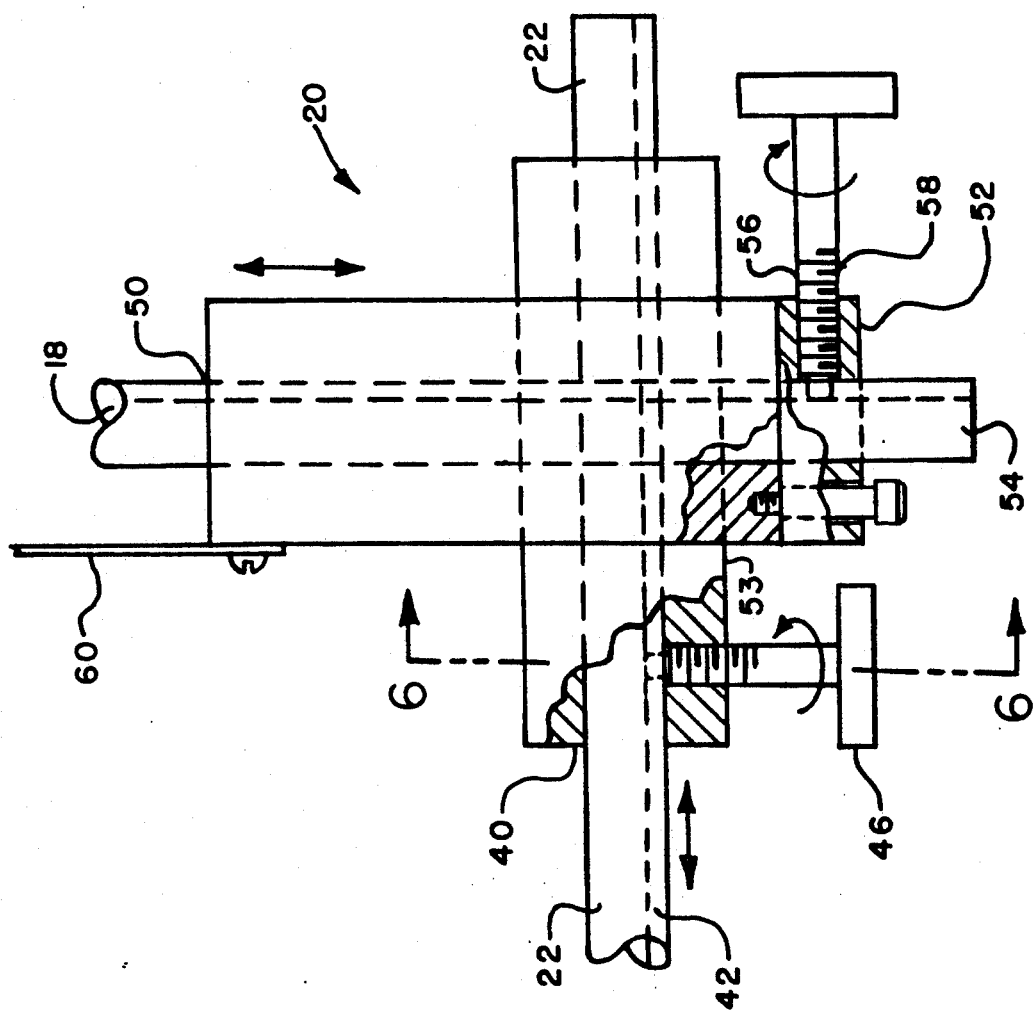
FIG. 5 is a sectional elevation view of a component of the gimbal assembly embodiment of the invention shown in FIGS. 1, 2 and 3.

The first arm 18 is positioned in sliding engagement with channel 50 of junction member 20 and also passes through an aperture in annular member or collar 52 as shown in FIG. 5. The first arm 18 also has a keyway 54 and the collar 52 has a threaded aperture 56 to receive a screw lock 58 therethrough in threaded engagement therewith, so that it can advance through the threaded aperture 56 into contact with the keyway 54 and fix the position of the collar 52 on said first arm 18, which in turn, provides a rotatable bearing surface 53 for the junction member 20, as shown or indicated in FIGS. 2 and 5.

Figure 6:
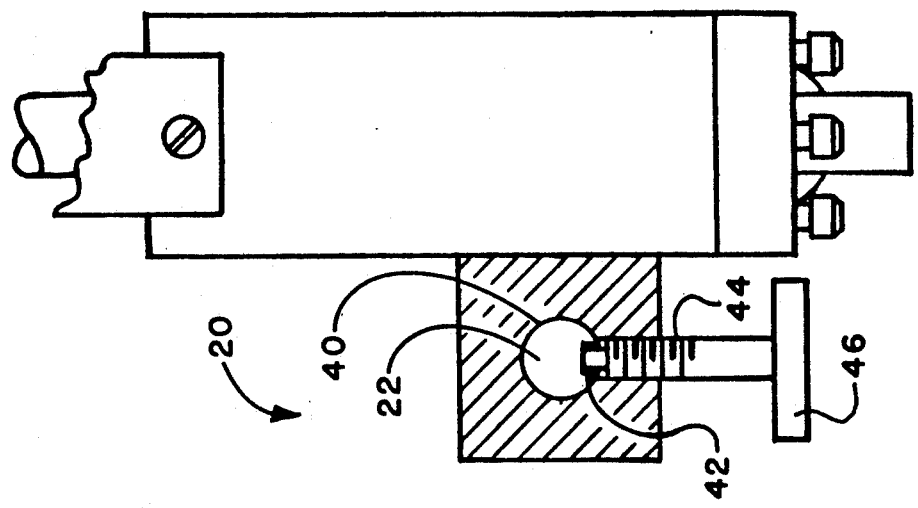
FIG. 6 is a cross-sectional elevation view of the component of FIG. 5 taken on lines 6—6, looking in the direction of the arrows.

Thus second arm 22 and pallet 28 can slide back and forth in junction member 20 and be fixed in a desired position by a turn of the locking screw 46 into the keyway 42 of such second arm 22 as indicated in FIGS. 5 and 6. Similarly, the junction member 50 and collar 52 (and thus the second arm 22 and pallet 28), can slide up and down axially on first arm 18, with collar 52 being lockable in a desired elevation thereon by a turn of the locking screw 18 into the keyway 54 of such first arm 18 as shown or indicated in FIGS. 1, 2 and 5.

The collar 52 is desirably pivotably attached to the bearing assembly 20 so that the latter may pivot on the former, e.g., through an arc of 110 degrees as indicated in FIG. 3. Thus collar 52 and bearing assembly 20, ride together up and down on first arm 18, generally with locking screw 58 extending partway into keyway 54 thereof for guidance purposes as collar 52 and bearing assembly 20 are moved therealong. The locking screw 58 can, at any desired elevation, be advanced into the threaded aperture 56 of the collar 52, to lock collar 52 and bearing assembly 20 in place on the first arm 18, as indicated in FIGS. 2, 3 and 5.

Similarly, the locking screw 46 extends partway into the keyway 42 of the second arm 22 to guide the first arm 18 as it slides back and forth in the channel 40 of the bearing assembly 20 and when such arm 22 and pallet 28 reach a desired position, the screw 46 can be advanced further into the keyway 42 of the second arm 22, to contact same and lock such arm and pallet in the desired lateral position, as shown or indicated in FIGS. 3, 5 and 6.

Providing upward lift to the junction member or bearing assembly 20 is negator (linear) spring 60 as shown in FIGS. 1, 5, 7, 8 and 9. The negator spring 60 is mounted on rotatable drum 62 (mounted in turn, on bracket assembly 64, pivotably mounted in turn, to the upper support member 14) and the other end of said negator spring 60 is attached to the bearing assembly 20 in a counter-force application, as shown or indicated in FIGS. 1, 2, 5, 7 and 8. The negator spring 60, also known as a constant-force spring, applies an upward counter-force to the linear bearing 20, second arm 22 and pallet 28 to substantially offset the weight thereof so that an operator may more easily maneuver the assembly in all directions as more fully discussed below.

Figure 10:
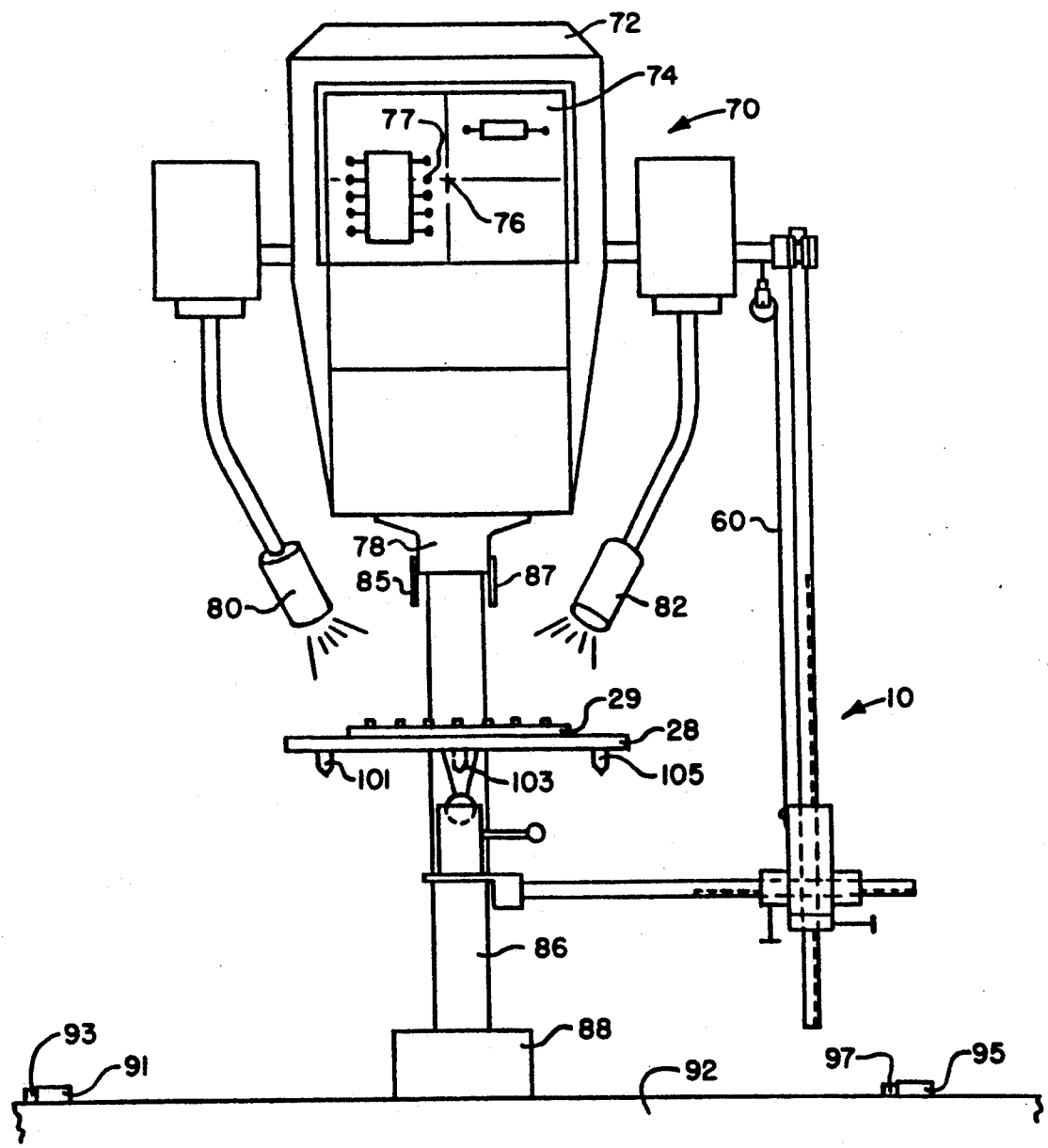
FIGS. 10 and 11 are front and side elevation views, respectively, of another gimbal assembly embodying the invention
Figure 11:
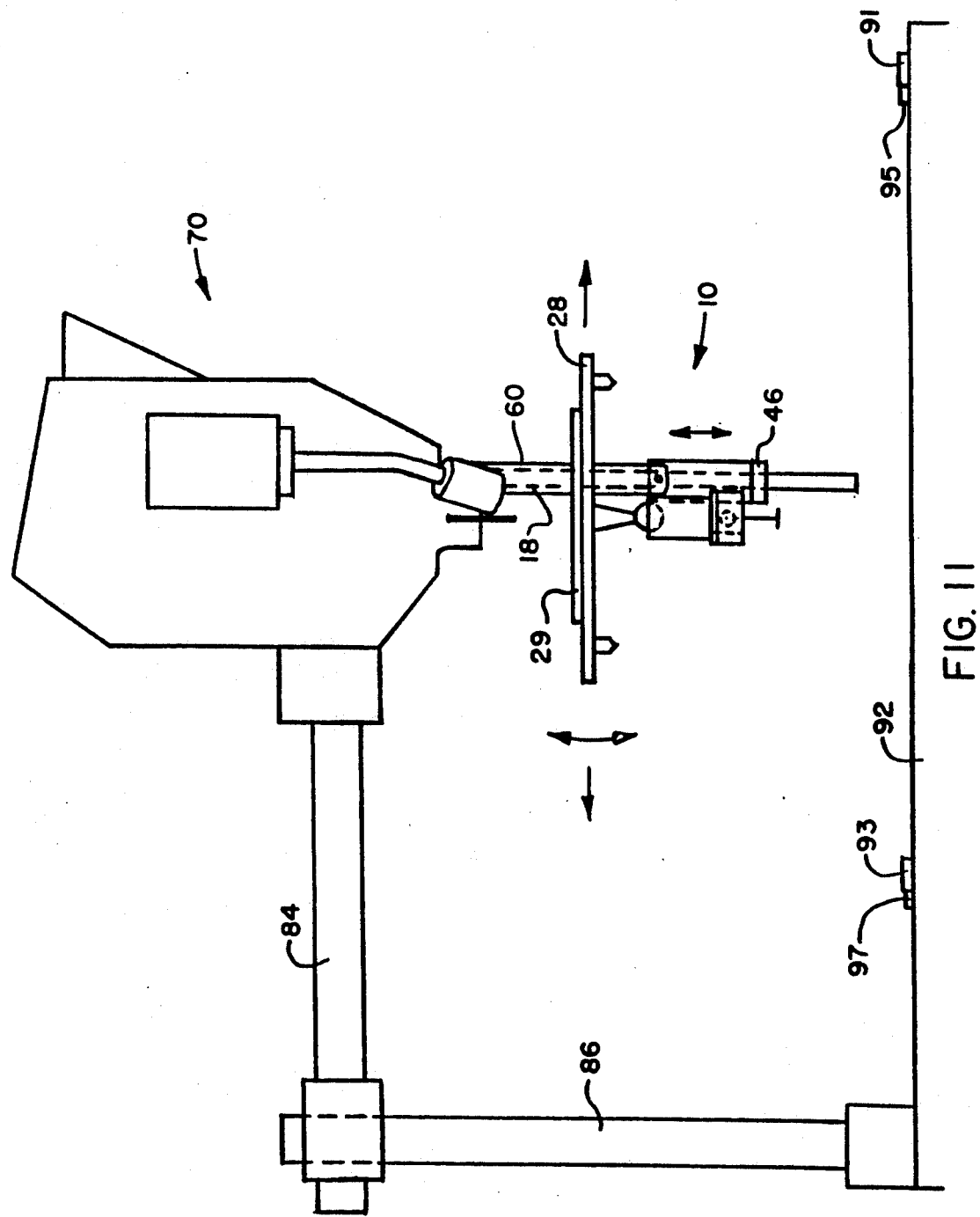

In an example of the use of the multi-axis positional gimbal embodying the invention, gimbal assembly 10 is mounted on a dynascope 70 as shown in FIGS. 10 and 11. The dynascope 70, which operates like a large microscope, has a housing 72, a viewing window 74, with cross-hairs 76, a viewing lens assembly 78, a pair of lamps 80 and 82 and offset support posts 84 and 86 with base 88, which mounts on a workbench 92, all as shown in FIGS. 10 and 11.

The operator places a substrate, such as a printed wiring assembly or PWA 29 on the pallet 28, as shown in FIGS. 2 and 10. The operator then, with dynascope 70 and lights 80 and 82 turned on, moves the pallet 28 by hand in any desired direction, e.g., laterally, upwardly or downwardly into focus in the window 74 of the dynascope 70 and then tilts such pallet, as desired, to locate a circuit defect, e.g., a soldering break 77 in the window 74, as indicated in FIG. 10.

Thus with the locking pins 46 and 58 extending partly into their respective keyways 42 and 54 but spaced from the bottom of such keyways, per FIGS. 3, 5 and 6 and with the aid of the negator spring 60, which counterbalances or compensates for the weight of the bearing assembly 20, second arm 22, pallet 28 and substrate 29, such pallet 28 can be maneuvered with little effort by the hand of the operator in any direction and angle and (with proper choice of negator spring) remain in place, when the operator's hand is removed, e.g., for note-taking or other duties. To insure that such pallet 28 remains in place, the operator can turn the locking screws 46 and 58, to make contact in their respective keyways with said second arm 22 and first arm 18 and can pivot the locking lever 32 against the ball 30, to lock the pallet 28 and substrate 29 in the desired attitude and position in the field of view of the dynascope, as shown or indicated in FIGS. 10 and 11.

The positional gimbal embodying the present invention is, as indicated above, readily moved into position and secured in place with a high degree of positional accuracy, which is important for locating and/or mapping small components in a PWA substrate (where chips can be as small as 0.05 inches across) and locating and/or mapping even smaller defects in such substrate such as soldering defects or improperly orientated components therein.

Thus the pallet and substrate are guided by hand, into the field of view of the stereo dynascope 70 and inspected in the dynascope window 74 of FIG. 10. When a defect is noticed, the pallet is shifted such that the defect is positioned under the intersection of the cross-hairs 76 of the window 74 and the gimbal assembly components locked in place as discussed above. At this point the operator's hands can be freed to make notes or perform other duties including operating a computerized Inspection Digitizing System (IDS) (not shown) which, utilizing emitters, e.g., emitters 85 and 87 mounted on the dynascope 70, and emitters 101, 103 and 105, by means known in the art, in combination with four spaced microphones (91, 93, 95 and 97) mounted below on the workbench 92, can map the location of the components and/or the defects in such substrate and provide a print-out of the coordinates thereof, e.g., for repair purposes.

Figure 12:
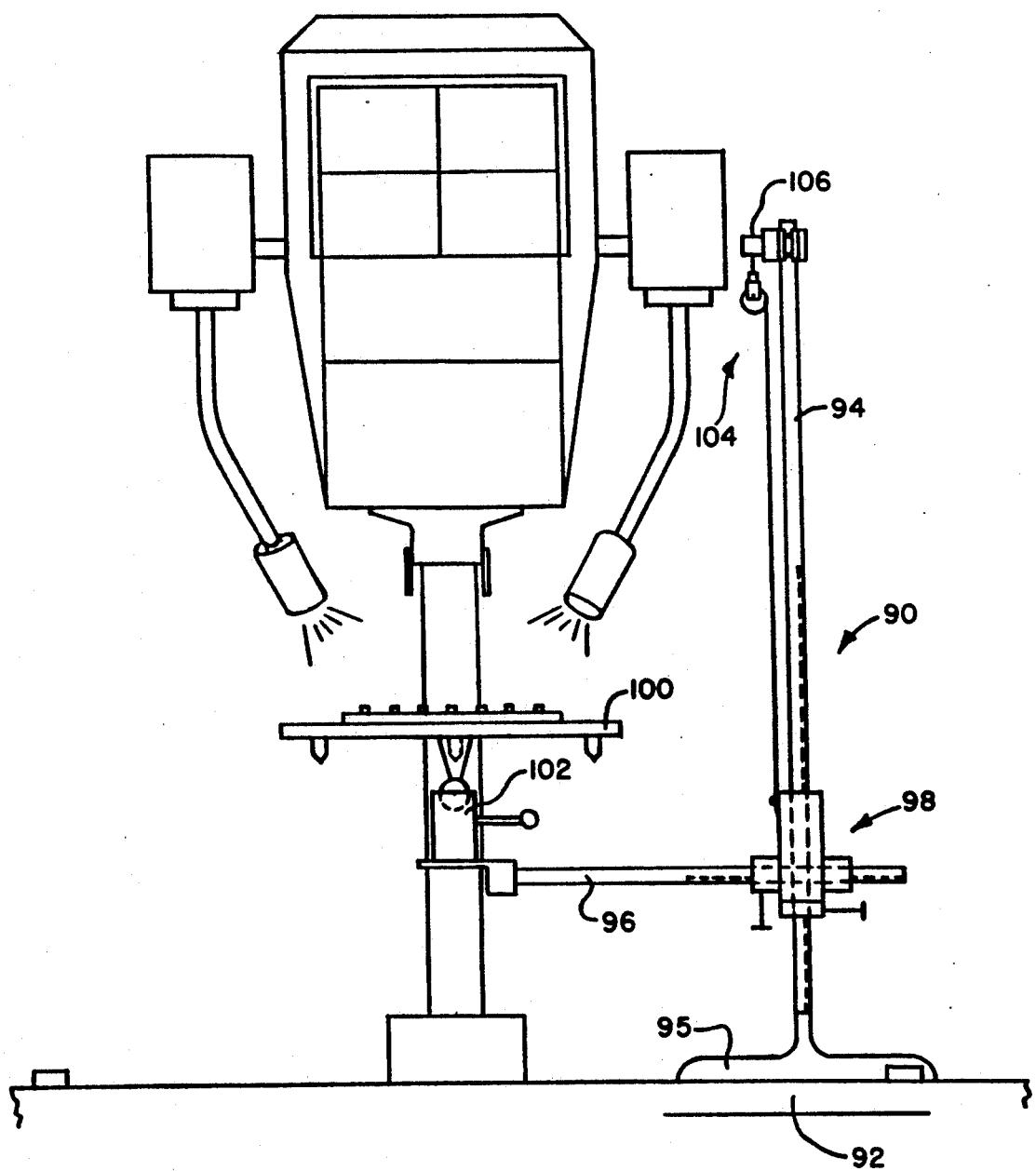
FIG. 12 is a front elevation view of yet another gimbal assembly embodying the invention.

In another embodiment of the invention, multi-axis positional gimbal 90 has a similar structure to the positional gimbal 10 embodying the invention, described above, except that it is supported on the bench 92, from below as shown in FIG. 12. That is the positional gimbal 90 has a first arm 94 and a second arm 96, passing through a bearing assembly 98, the second arm 96 supporting a pallet 100, on a ball and socket joint 102, as previously described with respect to positional gimbal 10 shown, e.g., in FIG. 10. However, first arm 94 is mounted on a base member 95, on the workbench 92, as shown in FIG. 12. Further, as shown, the bearing assembly 98 is counter-supported by negator spring assembly 104, pivotally attached to support stub 106, mounted in turn, to the upper portion of first arm 94, also as shown in FIG. 12.

Accordingly, the multi-axes positional gimbal embodying the present invention, is able to emulate the flexibility and range of movement achieved by hand-holding a substrate to inspect it, e.g., for defective components under a microscope, including multi-axis movement and tilting of such substrate and when a defect is found, to lock the pallet and substrate into the desired position for further inspection or mapping of the location thereof in the substrate. As previously noted, the operator's hands are then free to make notes, operate the IDS mapping system or perform other tasks.

The positional gimbal embodying the invention operates with an accuracy of a few thousandths of an inch which is necessary for inspection of small components or defects thereof such as those of a PWA substrate.

The positional gimbal of the invention can employ a pallet or other holding means to support an article of various sizes thereon and can be used with or without a microscope. The positional gimbal embodying the present invention can be used without a negator spring, within the scope of the invention but preferably employs such constant-force spring to facilitate the operation thereof. Where a spring is used, a constant-force spring is preferred although other types of springs can be employed such as a helical spring or a counterweight on a pulley, in place of a negator spring on a drum, if desired, within the scope of the invention.

The keyways and locking screws mounted on the first and second arms of the positional gimbal of the invention can be replaced by clamps of various types or dispensed with, if desired, within the scope of the invention. However, such keyways and screw locks are preferred.

Further, instead of a ball and socket joint, the pallet or other article holder can be positioned directly on the second arm, e.g., arm 22 of FIGS. 1 and 2 and said arm 22 can be pivoted on its axis, e.g., from side to side, within the scope of the invention. However, such ball and socket joint are preferred.

Finally, the positional gimbal of the invention can be free-standing, e.g., mounted on a bench, or be mounted to another surface or instrument, as indicated above. As noted above, the positional gimbal of the invention supports an article for inspection, which support can be moved in all directions as if the hand were holding the article, yet permits the highly accurate locking into position of such article for inspection and mapping of small components or defects while the operator's hands are free to perform other tasks.

Finally, the positional gimbal of the invention can be free-standing, e.g., mounted on a bench, or be mounted to another surface or instrument, as indicated above. As noted above, the positional gimbal of the invention supports an article for inspection, which support can be moved in all directions as if the hand were holding the article, yet permits the highly accurate locking into position of such article for inspection and mapping of small components or defects while the operator's hands are free to perform other tasks.

What is claimed is:

1. A multi-axis positional gimbal comprising, a first arm and a second arm mounted at an angle to each other to define a junction, means to adjust the length of said arms relative to said junction, an article support pivotably mounted to said second arm remote from said junction, a gimbal support, said first arm being mounted to said gimbal support at a portion thereof remote from said junction, means to pivot said second arm at said junction laterally relative to said first arm so as to move said article support on all three axes as desired, said article support being pivotably mounted on a ball and socket assembly, mounted in turn to said second arm remote from said junction.

2. The gimbal of claim 1 wherein said support member includes a pallet pivotably mounted on said ball and socket assembly.

3. The gimbal of claim 2 wherein the means to mount said assembly to a support surface is a third arm which connects from said support surface to a portion of said first arm remote from said junction member and at an angle therewith; said third arm, junction assembly and third arm, defining inside angles therebetween; a spring assembly mounted between said third arm and said junction member on the side of said first arm proximate said inside angles; said spring assembly being maintained under contractive tension so as to provide a lifting leverage force in opposition to the weight of said pallet and its ball and socket joint.

4. A multi-axis positional gimbal assembly comprising, a junction member having two passageways therein at angles to each other, a firs arm sized to insert into one of said passageways and to axially shift therein, a second are sized to insert into the other of said passageways and to axially shift therein, locking means to releasably secure said arms in said passageways, a pallet pivotally mounted on said second arm on a wall and socket assembly at a point remote from said junction member, means to pivot said second arm and junction member about the axis of said first arm to move said pallet on all three axes as desired and means to mount said first arm on a support member at a portion remote from said junction member to thus mount said assembly.

5. The gimbal assembly of claim 4 wherein said ball and socket support have a releasable locking means mounted thereto, to lock said pallet in a desired attitude.

6. The gimbal assembly of claim 4 wherein said arms are positioned in said junction member at right angles to each other.

7. The gimbal of claim 4 wherein the means to mount said assembly to a support surface is a third arm which connects from said support surface to a portion of said first arm remote from said junction member and at an angle therewith; said third arm, first arm, junction assembly and third arm, defining inside angles therebetween; a spring assembly mounted between said third arm and said junction member on the side of said first arm proximate said inside angles; said spring assembly being maintained under contractive tension so as to provide a lifting leverage force in opposition to the weight of said pallet and its ball and socket joint.

8. The gimbal assembly of claim 4 wherein each arm has a keyway along at least a portion of the length thereof and said junction member has a plurality of apertures through each of said passageways which can align with the keyway of each of said arms inserted therein and receive locking pins therein, to releasably lock said arms in desired position in said junction member.

9. The gimbal of claim 4 wherein said junction assembly has a linear and rotary bearing in the passageway that receives said first arm and a linear bearing in the passageway that receives said second arm.

10. The gimbal of claim 7 wherein said spring assembly is a negator spring having a spring which retracts around a drum member or extends therefrom, in response to positioning said junction assembly upwardly or downwardly on said first arm.

11. The gimbal assembly of claim 4 having a negator spring mounted to connect under resilient tension, said junction member to a portion of said first arm remote therefrom so as to provide support for said junction member and thus said second arm proximate the axis of said first member when said locking pin is removed from said junction member and said second arm to permit the rotation thereof about the axis of said first arm.

* * * * *